(12) United States Patent
Loopstra et al.

(10) Patent No.: US 8,289,498 B2
(45) Date of Patent: Oct. 16, 2012

(54) LITHOGRAPHIC APPARATUS AND DEVICE MANUFACTURING METHOD

(75) Inventors: Erik Roelof Loopstra, Eindhoven (NL); Petrus Rutgerus Bartray, Ysselsteyn (NL); Leon Martin Levasier, Hedel (NL); Bernardus Antonius Johannes Luttikhuis, Nuenen (NL); Josephus Jacobus Smits, Geldrop (NL); Anthonie Aantjes, Best (NL); Maurice Willem Jozef Etiënne Wijckmans, Eindhoven (NL); Johannes Bernardus Ridder, Veldhoven (NL); Andre Schreuder, Eindhoven (NL); Dennis Jozef Maria Paulussen, Eindhoven (NL); Peter Gerardus Jonkers, Eindhoven (NL); Hugues Poincelin, Asnières sur Seine (FR); Fransiscus Theresia Noel Heusschen, Breugel (NL)

(73) Assignee: ASML Netherlands B.V., Veldhoven (NL)

( * ) Notice: Subject to any disclaimer, the term of this patent is extended or adjusted under 35 U.S.C. 154(b) by 623 days.

(21) Appl. No.: 12/483,703

(22) Filed: Jun. 12, 2009

(65) Prior Publication Data
US 2010/0002207 A1 Jan. 7, 2010

Related U.S. Application Data

(60) Provisional application No. 61/129,252, filed on Jun. 13, 2008.

(51) Int. Cl.
*G03B 27/42* (2006.01)
*G03B 27/52* (2006.01)

(52) U.S. Cl. .......................................... 355/53; 355/30

(58) Field of Classification Search .................... 355/30, 355/53
See application file for complete search history.

(56) References Cited

U.S. PATENT DOCUMENTS

| 5,305,364 A | | 4/1994 | Mochiji et al. |
| 5,986,743 A | * | 11/1999 | Hanzawa ........................ 355/53 |
| 6,031,598 A | * | 2/2000 | Tichenor et al. ................ 355/67 |
| 6,198,792 B1 | | 3/2001 | Kanouff et al. |
| 6,333,775 B1 | * | 12/2001 | Haney et al. .................... 355/30 |
| 6,621,556 B2 | | 9/2003 | Iwasaki et al. |
| 6,642,996 B2 | | 11/2003 | Nogawa |

(Continued)

FOREIGN PATENT DOCUMENTS

EP 0532968 A1 3/1993

(Continued)

OTHER PUBLICATIONS

Japanese Office Action for Japanese Patent Application No. 2009-135672, mailed on Jul. 11, 2011.

*Primary Examiner* — Hung Henry Nguyen
*Assistant Examiner* — Steven H Whitesell Gordon
(74) *Attorney, Agent, or Firm* — Pillsbury Winthrop Shaw Pittman LLP

(57) ABSTRACT

A lithographic apparatus includes a projection system configured to project an image onto a substrate, a substrate table configured to support the substrate, a first chamber that at least partially surrounds the projection system, and a second chamber that at least partially surrounds the substrate table and a first frame. The apparatus includes a base frame configured to support the second chamber, and an intermediate frame coupled to the base frame. The intermediate frame is configured to separate the first chamber and the second chamber. The apparatus includes a support coupled to the first frame. The support is configured to support the first chamber through a coupled opening in the intermediate frame and the second chamber.

8 Claims, 7 Drawing Sheets

U.S. PATENT DOCUMENTS

| | | |
|---|---|---|
| 6,683,936 B2 | 1/2004 | Jonkers |
| 6,853,443 B2 * | 2/2005 | Nishi .................... 355/72 |
| 6,961,113 B1 * | 11/2005 | Hayashi et al. .................. 355/30 |
| 7,130,016 B2 | 10/2006 | Miyajima |
| 7,227,617 B2 | 6/2007 | Hara |
| 2002/0048002 A1 | 4/2002 | Haney et al. |
| 2002/0126269 A1 * | 9/2002 | Sato ................... 355/77 |
| 2002/0145711 A1 * | 10/2002 | Magome et al. ............... 355/30 |
| 2003/0035094 A1 * | 2/2003 | Hazelton et al. ............... 355/72 |
| 2003/0048428 A1 | 3/2003 | Kemper et al. |
| 2004/0075201 A1 | 4/2004 | Yoda |
| 2005/0030504 A1 | 2/2005 | Terashima et al. |
| 2005/0069433 A1 | 3/2005 | Hayashi |
| 2005/0168712 A1 | 8/2005 | Miyajima |
| 2006/0007414 A1 | 1/2006 | Luttikhuis et al. |
| 2006/0023180 A1 | 2/2006 | Hara |
| 2006/0127811 A1 | 6/2006 | Moors et al. |
| 2006/0215137 A1 | 9/2006 | Hasegawa et al. |
| 2008/0068568 A1 * | 3/2008 | Ebihara et al. ................ 355/30 |
| 2009/0033895 A1 * | 2/2009 | Binnard et al. ................ 355/53 |
| 2009/0190117 A1 * | 7/2009 | Ono et al. .................... 355/67 |

FOREIGN PATENT DOCUMENTS

| | | |
|---|---|---|
| JP | 61-067917 A | 4/1986 |
| JP | 2001-319873 A | 11/2001 |
| JP | 2005-223011 A | 8/2005 |
| JP | 2006-017994 A | 1/2006 |
| JP | 2006-041338 A | 2/2006 |
| JP | 2007-027258 A | 2/2007 |
| WO | 2005/083759 A1 | 9/2005 |

* cited by examiner

Design 1

Design 2

LITHOGRAPHIC APPARATUS AND DEVICE MANUFACTURING METHOD

CROSS-REFERENCE TO RELATED APPLICATIONS

This application claims the benefit of priority from U.S. Provisional Patent Application Ser. No. 61/129,252, filed on Jun. 13, 2008, the content of which is incorporated herein by reference in its entirety.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a lithographic apparatus operated in a vacuum environment (e.g. extreme ultraviolet, or EUV, lithography, electron-beam lithography, ion-beam lithography or X-ray lithography), modules (e.g. illumination system, mask table, projection lens or wafer table) of the lithographic apparatus may be separated from each other in different vacuum chambers, due mainly to control negative impacts from contamination. At the same time, these separated chambers are coupled to each other in such a way as to form a lithographic apparatus. Coupling of such chambers may cause issues because each chamber has different tolerances for vibrations (i.e., dynamic noise), normally generated by moving parts in the lithographic apparatus (e.g. mask table or wafer table). To minimize the impact of such vibrations from one chamber to the other, a lithographic apparatus has been separated into a so-called "noisy world" and a so-called "silent world".

The noisy world in practice may be represented by modules including a base frame dynamically coupled to IC manufacturing factory's floor, which receives all vibrations generated by, for example, operators walking inside such factory.

On the other hand, the silent world may be represented by modules dynamically isolated from the noisy world by employing contact-less supports (e.g. air-foot, air-bearing, magnetic-force levitation, etc) so as to minimize the impact from vibrations generated by any potential sources especially the higher frequency parts of these vibrations (e.g. moving standard deviation parts out from moving average parts).

Vacuum chambers include seals in its opening areas. To minimize the impact of the vibration from the noisy world to the silent world, as disclosed in U.S. Pat. No. 6,333,775 B1 and U.S. Patent Application Publication No. 2006/0007414A1, there is even a contact-less seal introduced. However, it may be difficult to prevent molecular level particles (e.g. hydrocarbon and/or water) from traveling from one chamber to the other by using such a contact-less seal, and if these particles reach the optics in a lithographic apparatus, it may hamper the operation of the optics, as well as contaminate the optics. This may hinder a respective device manufacturing method leading to relatively expensive and/or low-quality devices manufactured thereby.

SUMMARY

One potential solution for this is to apply a seal such as a bellows, although such bellows would generate dynamic contact between the noisy world and the silent world, which may translate unwanted vibrations towards the silent world.

According to an aspect of the invention, there is provided a lithographic apparatus that includes a projection system configured to project an image onto a substrate, a substrate table configured to support the substrate, a first chamber that at least partially surrounds the projection system, and a second chamber that at least partially surrounds the substrate table and a first frame. The apparatus includes a base frame configured to support the second chamber, and an intermediate frame coupled to the base frame. The intermediate frame is configured to separate the first chamber and the second chamber. The apparatus includes a support coupled to the first frame. The support is configured to support the first chamber through a coupled opening in the intermediate frame and the second chamber.

According to an aspect of the invention, there is provided a device manufacturing method that includes patterning a radiation beam, projecting the patterned radiation beam onto a substrate with a projection system enclosed by a first chamber, supporting a substrate with a substrate table enclosed by a second chamber supported with a base frame, separating the first chamber and the second chamber with an intermediate frame coupled to the base frame, and supporting the first chamber through a coupled opening in the intermediate frame and the second chamber with a support coupled to a first frame enclosed by the second chamber.

According to an aspect of the invention, there is provided a device manufacturing method that includes patterning a radiation beam, projecting the patterned radiation beam onto a substrate with a projection system, supporting a substrate with a substrate table, and enclosing the projection system with a first chamber. The method includes enclosing the substrate table and a first frame with a second chamber, supporting the second chamber with a base frame, and separating the first chamber and the second chamber with an intermediate frame coupled to the base frame. The method includes supporting the first chamber through a coupled opening in the intermediate frame and the second chamber with a support coupled to the first frame.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
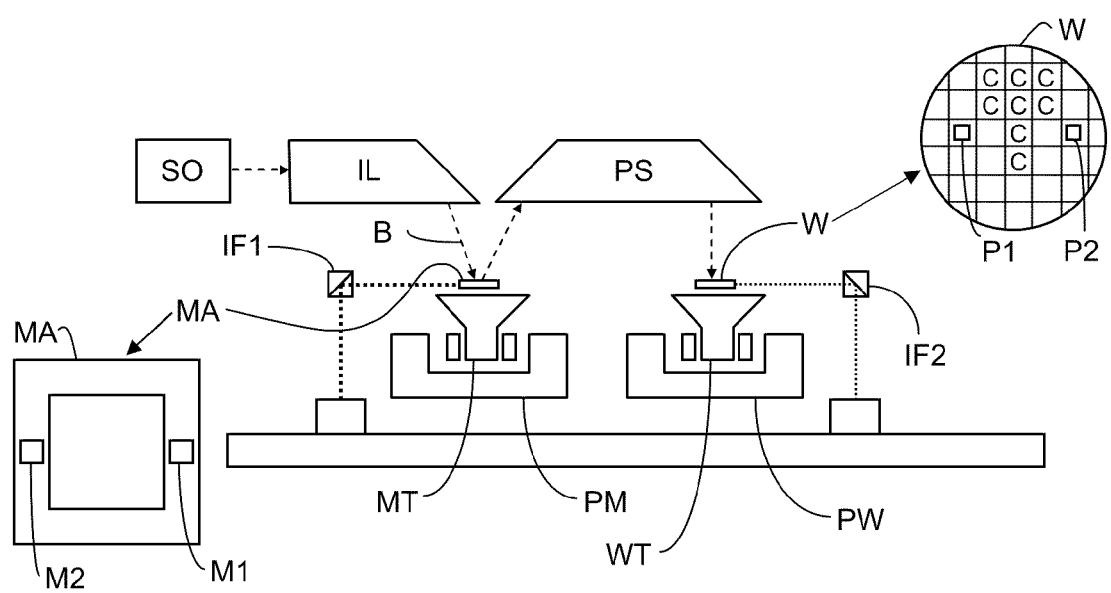
FIG. 1 depicts a lithographic apparatus according to an embodiment of the present invention.

FIG. 1 schematically depicts a lithographic apparatus. The apparatus comprises: an illumination system (illuminator) IL configured to condition a radiation beam B (e.g. UV radiation, DUV radiation, EUV radiation or X-ray); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus, for example when the source is a mercury lamp. The source SO and the illuminator IL, together with the beam delivery system (not shown in FIG. 1) if desired, may be referred to as a radiation system.

The illuminator IL may comprise an adjuster (not shown in FIG. 1) for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator (not shown in FIG. 1) and a condenser (not shown in FIG. 1). The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In an EUV lithographic apparatus, a vacuum chamber (with may be referred to as a projection optics box or "POB") comprising the projection system PS may be separated from another vacuum chamber ("WT vacuum chamber") comprising the substrate table WT. The WT vacuum chamber has several orders higher contamination levels (hydrocarbons etc. which influence the optic mirror lifetime) than the POB because of the high amount of functionality in the WT vacuum chamber (stages, cabling, handlers to move the substrate, sensors, etc.). Therefore, the flow of contamination from WT vacuum chamber to POB should be minimized. However in a known design, there are two leakages between the WT vacuum chamber and POB: 1) a shared opening between the POB and WT vacuum chamber, where EUV light enters from the projection system PS to WT vacuum chamber (wafer topside); and 2) a contact-less vacuum seal around a first frame, to which a position sensor may be mounted, towards base frame. A very soft, thin and airtight material may form a bellows to cover such a contact-less vacuum seal around the first frame to prevent from the contamination.

The soft, thin and airtight material may be any type of rubber, including but not limited to acrylic rubber, butadiene rubber, butyl rubber, chlorobutyl, any chemical types of polyethylene rubber, epichlorhydrin, ethylene acrylic, ethylene propylene rubber, fluoroelastomers, hydrogenated nitrile rubber, isoprene rubber, natural rubber, nitrile rubber, perfluoro elastomers, polychloroprene, polynorbornene rubber, polysulphide rubber, silicone rubber, styrene butadiene rubber, tetra-flouroethylene rubber, etc. Polyimide, (metal coated) teflon or (metal coated) plastics or foils with a (double-sided) metal coating may also be used as material to form the bellows. The bellows may be electroformed bellows, e.g. made of Nickel. The bellows may have straight circular grooves and/or helical grooves.

The soft, thin and airtight material may also be a metal or any material (or combination of materials) that has the desired stiffness specifications.

Figure 7:
FIG. 7 depicts an embodiment a bellows as a part of the lithographic apparatus according to an embodiment of the invention.

The bellows can be a hollow with a small thickness as shown in FIG. 7.

In solid mechanics, torsion is the twisting of an object due to an applied torque. In circular sections, the resultant shearing stress is perpendicular to the radius.

The torsion constant (or the polar moment of inertia) J for a section can be described as:

$$J = 2\pi R^3 t \qquad (1)$$

where R is the average of the outer and inner radius and t is the wall thickness.

Thus, stiffness is increased by power of 3 from radius ($R^3$) of the bellows.

Thus, the stiffness of such material is determined as a function of sealing length (periphery of bellows=$2\pi$ R). Therefore, in case a lithographic apparatus employs the bellows to seal the gap between the chambers, more specifically a base frame (in the noisy world) and a first frame (in the silent world), the lithographic apparatus should minimize the "sealing length" so that to minimize vibration transferring from the base frame to the first frame by the rotational stiffness of the bellows.

An embodiment of the invention is related to minimize the sealing length.

Figure 5:
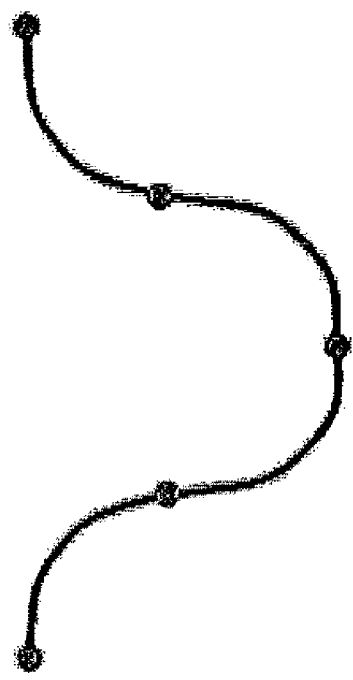
FIG. 5 depicts bellows with different shapes as a part of the lithographic apparatus according to an embodiment of the invention.
Figure 5:
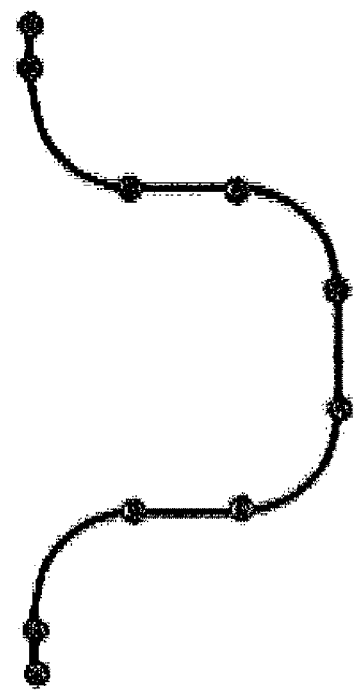

Besides the bellows diameter and the material, the overall bellows shape is also an influencing parameter. As shown in FIG. 5, the shape can be optimized so as not to transfer any unwanted vibrations from the noisy world to the silent world. An example of the bellows employing the concept of the design 2 is shown in the FIG. 7.

Another influencing parameter is the thickness of the bellows because if the thickness of the bellows is thinner, the bellows will become weaker.

Figure 2:
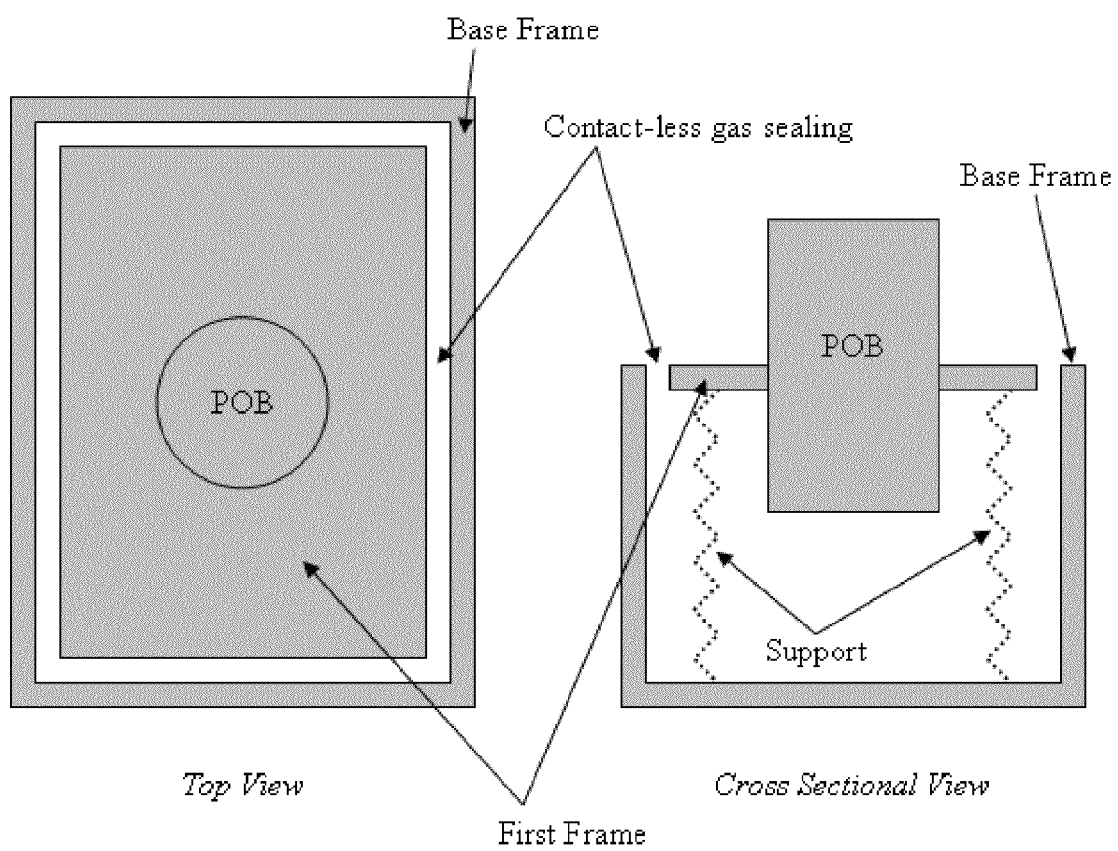
FIG. 2 depicts a part of the lithographic apparatus of FIG. 1.

FIG. 2 schematically shows part of a lithographic apparatus that employs a contact-less gas seal between the base frame and the first frame. The support in FIG. 2 may be a contact-less support, such as an air-bearing support. In FIG. 2, the first frame and the projection optics box POB are connected to each other, and the assembly is dynamically isolated since there is no dynamic contact between the base frame and the first frame.

If the contact-less gas seal is replaced with the bellows, the sealing length will become as large as the surrounding length of the first frame (all openings between the first frame and the base frame). The relatively long sealing length may cause a vibration issue in the silent world due as the rotational stiffness of the seal may transfer the vibration in the noisy world into the silent world.

Figure 3:
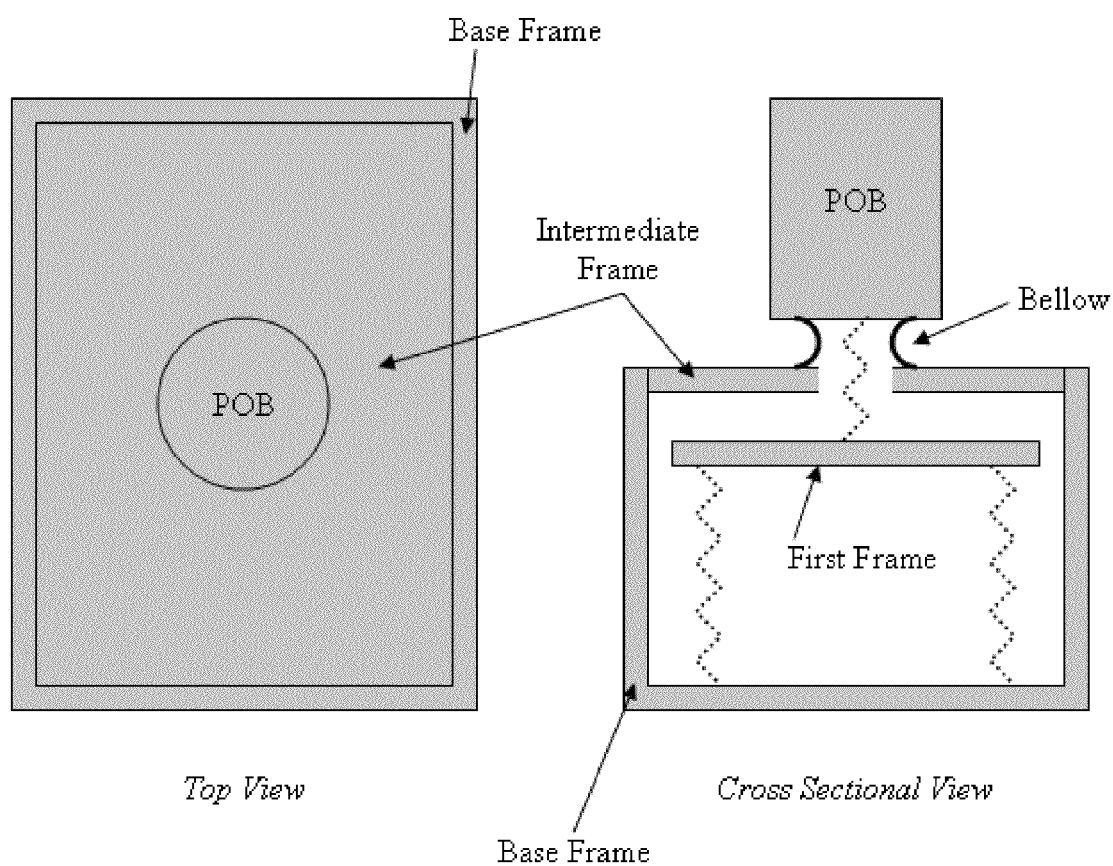
FIG. 3 depicts a part of the lithographic apparatus of FIG. 1 according to an embodiment of the invention.

FIG. 3 shows a schematic view of part of the lithographic apparatus according to an embodiment of the present invention, which embodiment does not employ the contact-less gas seal, but instead employs a bellows. As shown in FIG. 3, the first frame is not connected to the projection optics box POB but is separated, and there is an additional support introduced to support the projection optics box POB and projection system PS by the first frame.

To minimize the dynamic impact from the noisy world to the silent world, the sealing length should be minimized. To this end, there is an intermediate frame introduced, which is coupled to the base frame. A bellows is placed between the POB (the first chamber) and the intermediate frame to seal the space between the support and the intermediate frame. Alternatively, the bellows may be placed between the intermediate frame and the first frame to seal the space between the support and the intermediate frame. The intermediate frame has a limited area of an opening so as to minimize the sealing length.

By introducing an intermediate frame (connected with the base frame) that has a relatively small through-hole to support the projection optics box POB and the projection system PS and the first frame, the sealing length may be minimized.

There may be a plurality of supports, e.g. 3 or 6 supports, to support the projection system PS when the lithographic apparatus provides six DOF (degree of freedom) on the projection system PS control. Thus, there may be, a plurality of through-holes in the intermediate frame, e.g. 3 or 6 through-holes.

Figure 4:
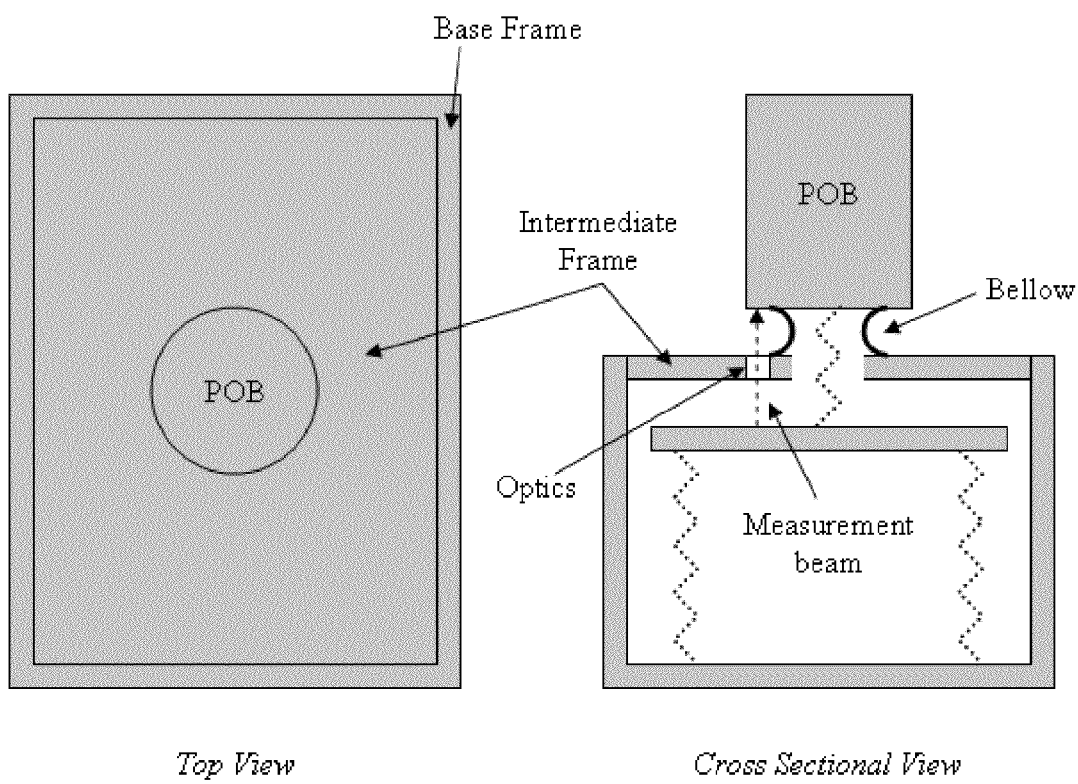
FIG. 4 depicts a part of the lithographic apparatus according to an embodiment of the invention.

FIG. 4 shows a schematic view of part of the lithographic apparatus according to an embodiment of the present invention. An optics at the intermediate frame may be used to let a measurement beam pass through the optics. Such a measurement beam may detect the positioning of the projection system PS with respect to the first frame and/or to the substrate table WT so as to provide accurate position control.

Note that in this embodiment, the optics should be physically placed so as not to generate any (or a minimum) opening at the intermediate frame. This is due to the contamination control since if there is an extra opening at the intermediate frame, the opening may make particles pass through into the POB.

In addition, there may be a plurality of such optics and measurement beams, although FIG. 4 only shows a single optics and measurement beam.

Figure 6:
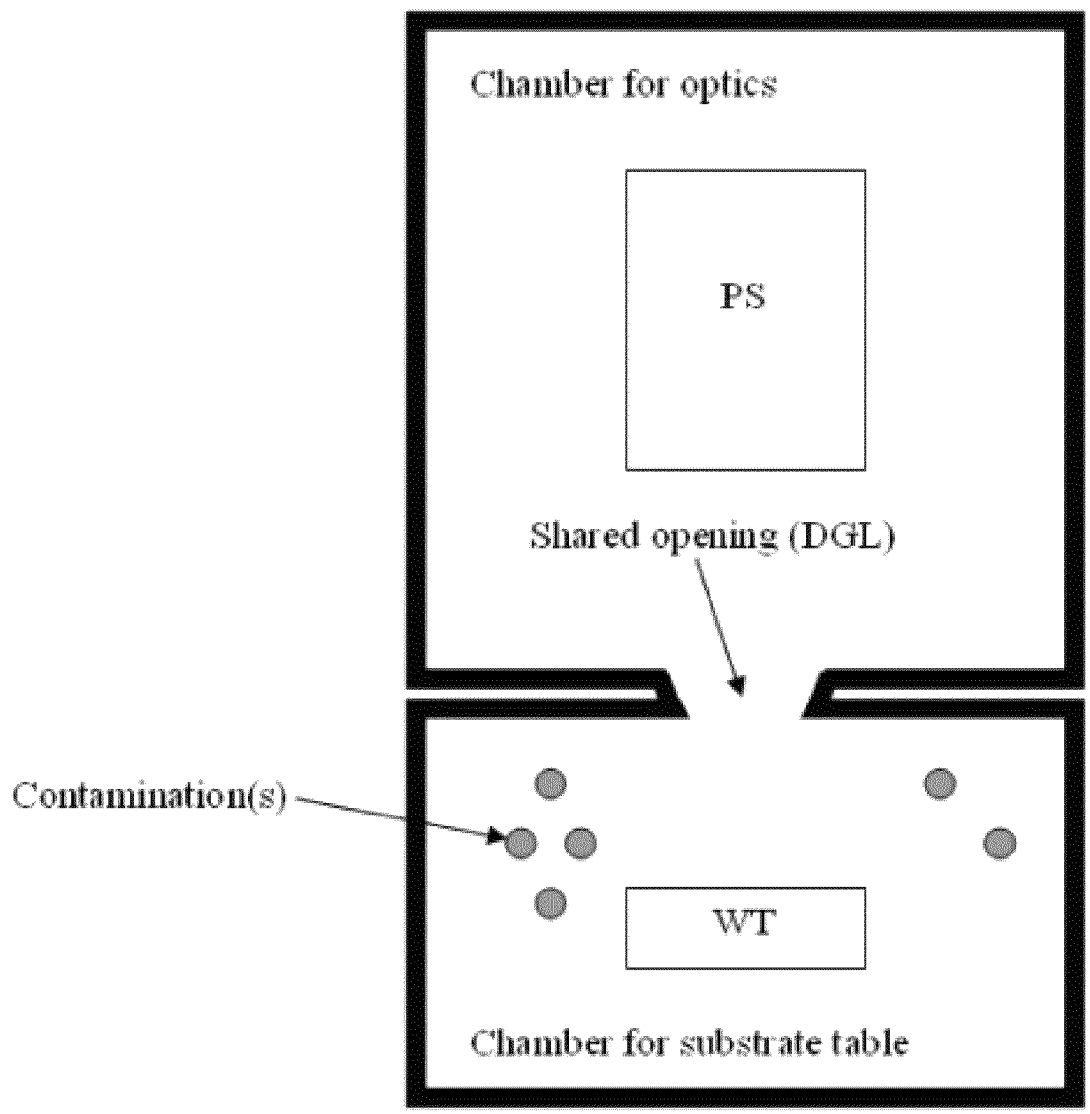
FIG. 6 depicts a part of the lithographic apparatus according to an embodiment of the invention.

FIG. 6 schematically depicts a lithographic apparatus according to a non-limiting embodiment of the invention. The chamber (e.g. vacuum chamber) for optics and the chamber (e.g. vacuum chamber) for the substrate table or "substrate support" are shown in the Figure so as to illustrate the non-limiting concept of the shared "opening" between the chambers, a so-called dynamic gas lock (DGL), where gas flows are maintained to prevent contamination(s) from traveling through the opening.

The gas employed in the dynamic gas lock DGL should be a substance that does not substantially absorb the radiation in the projection beam (e.g. EUV), while having a substantially low diffusion coefficient for contaminants. Examples of such gases that have been used in dynamic gas locks are H, Ar and Kr. A dynamic gas lock that uses gases such as Ar is described in U.S. Pat. No. 6,198,792 B1, which describes a hole in a membrane, the membrane separating the projection system area from the substrate area, the hole being for allowing the projected radiation to impinge on the substrate. The inert gas flows across the transmission direction of the radiation beam.

A dynamic gas lock which describes a flow going in the same direction as the projected radiation, which further has a membrane or window through which the projected radiation should be transmitted is described in U.S. Pat. No. 6,683,936 B2, U.S. Pat. No. 6,642,996 B2 and European Patent Application Publication No. 0 532 968 A1. The hollow tube of these latter documents that directs the inert gas may be cone-shaped and is covered at its top end by a membrane through which the radiation must travel before impinging on the substrate. The membrane prevents the inert gas from flowing upwards towards the projection system.

In FIG. 6, a first chamber for optics contains the projection system PS while a second chamber for the substrate table contains the substrate table WT. The first and the second chambers are coupled to each other via a shared opening, such as the dynamic gas lock DGL described above.

The projection system PS may consist of reflective optics (e.g. mirrors), which surface flatness is controlled with the atomic level. Such optics may easily be damaged in case small particles come into the first chamber and are attached on the surface of the optics.

Therefore, although both chambers are typically under very high vacuum levels during operation, the chamber for the projection system PS is typically maintained with higher pressure than it is in the chamber for substrate table WT, because the optics should be kept as clean as possible while the chamber for substrate is normally a source of unwanted molecules contaminations (e.g. out-gassing from resist, particles generated due to movable parts like wafer stages). In practice, the first chamber may be purged (although the pressure of the chamber is very low) with a certain gas (e.g. hydrogen, nitrogen, helium or carbon dioxide) to keep optical elements for the projection system PS clean.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a first tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example electron beam lithography, and where the context allows, is not limited to optical lithography.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   a projection system configured to project an image onto a substrate;
   a substrate table configured to support the substrate;
   a first vacuum chamber at least partially surrounding the projection system;
   a second vacuum chamber enclosing the substrate table and a first frame;
   a base frame configured to support the second vacuum chamber;
   an intermediate frame coupled to the base frame, the intermediate frame being configured to separate the first vacuum chamber and the second vacuum chamber; and
   a support coupled to the first frame, the support being configured to support the first vacuum chamber through a coupled opening in the intermediate frame and the second vacuum chamber.

2. The lithographic apparatus according to claim 1, further comprising a seal configured to seal a space between the first vacuum chamber and the intermediate frame.

3. The lithographic apparatus according to claim 2, wherein the seal comprises any one or combinations of acrylic rubber, butadiene rubber, butyl rubber, chlorobutyl, polyethylene rubber, epichlorhydrin, ethylene acrylic, ethylene propylene rubber, fluoroelastomers, hydrogenated nitrile rubber, isoprene rubber, natural rubber, nitrile rubber, perfluoro elastomers, polychloroprene, polynorbornene rubber, polysulphide rubber, silicone rubber, styrene butadiene rubber and tetra-flouroethylene rubber.

4. The lithographic apparatus according to claim 2, wherein the seal comprises metals or metal containing materials.

5. The lithographic apparatus according to claim 1, wherein the first frame comprises a measurement system configured to measure a position of the substrate table and/or the projection system.

6. The lithographic apparatus according to claim 5, wherein the intermediate frame further comprises a transparent window for position measurement.

7. The lithographic apparatus according to claim 6, wherein the transparent window is part of an optical path of the measurement system that measures a position of the projection system and/or the substrate table.

8. A device manufacturing method comprising:
   patterning a radiation beam;
   projecting the patterned radiation beam onto a substrate with a projection system enclosed by a first vacuum chamber;
   supporting a substrate with a substrate table enclosed by a second vacuum chamber supported with a base frame;
   separating the first vacuum chamber and the second vacuum chamber with an intermediate frame coupled to the base frame; and
   supporting the first vacuum chamber through a coupled opening in the intermediate frame and the second vacuum chamber with a support coupled to a first frame enclosed by the second vacuum chamber.

* * * * *